United States Patent
Song et al.

(10) Patent No.: US 10,928,877 B2
(45) Date of Patent: Feb. 23, 2021

(54) COMMUNICATION DEVICE FOR PREDICTING POWER CONSUMPTION OF MOBILE APPLICATION, COMMUNICATION SYSTEM INCLUDING SAME, METHOD OF PREDICTING POWER CONSUMPTION OF MOBILE APPLICATION AND METHOD OF PROVIDING PREDICTED POWER CONSUMPTION OF MOBILE APPLICATION, USING SAME

(71) Applicant: Korea Advanced Institute of Science and Technology, Daejeon (KR)

(72) Inventors: Junehwa Song, Daejeon (KR); Chulhong Min, Seoul (KR); Youngki Lee, Daejeon (KR); Chungkuk Yoo, Daejeon (KR); Seungwoo Kang, Cheonan (KR); Sangwon Choi, Daejeon (KR); Pillsoon Park, Daejeon (KR); Inseok Hwang, Daejeon (KR); Younghyun Ju, Daejeon (KR); Seungpyo Choi, Daejeon (KR)

(73) Assignee: KOREA ADVANCED INSTITUTE OF SCIENCE & TECHNOLOGY, Daejeon (KR)

( * ) Notice: Subject to any disclaimer, the term of this patent is extended or adjusted under 35 U.S.C. 154(b) by 125 days.

(21) Appl. No.: 16/083,526

(22) PCT Filed: Mar. 9, 2017

(86) PCT No.: PCT/KR2017/002548
§ 371 (c)(1),
(2) Date: Sep. 10, 2018

(87) PCT Pub. No.: WO2017/155322
PCT Pub. Date: Sep. 14, 2017

(65) Prior Publication Data
US 2019/0101968 A1 Apr. 4, 2019

(30) Foreign Application Priority Data
Mar. 10, 2016 (KR) .................. 10-2016-0028759

(51) Int. Cl.
*G06F 1/00* (2006.01)
*G06F 1/28* (2006.01)
(Continued)

(52) U.S. Cl.
CPC ........... *G06F 1/28* (2013.01); *G01R 31/2875* (2013.01); *G06F 1/1694* (2013.01);
(Continued)

(58) Field of Classification Search
CPC ........ G06F 1/28; G06F 1/1694; G06F 1/3215; G06F 9/4893; G06F 1/1698;
(Continued)

(56) References Cited

U.S. PATENT DOCUMENTS

2009/0312072 A1* 12/2009 Hong .................. G01R 31/367
455/573
2012/0052817 A1* 3/2012 Lee .................. H04W 52/0258
455/68

(Continued)

FOREIGN PATENT DOCUMENTS

JP 2012-063917 A 3/2012
KR 10-2012-885724 A 8/2012
(Continued)

OTHER PUBLICATIONS

Min et al., "PowerForecaster: Predicting Smartphone Power Impact of Continuous Sensing Applications at Pre-installation Time," SenSys '15, Nov. 2015, Seoul, South Korea.
(Continued)

*Primary Examiner* — Volvick Derose
(74) *Attorney, Agent, or Firm* — Cho-Won IP Consulting; Hyun Ho Song

(57) ABSTRACT

Disclosed herein is a communication device, which comprises a user trace manager, a power emulator, and a power impact estimator. The user trace manager manages a user's
(Continued)

sensor usage trace and device usage trace, which shows the user's mobile device usage pattern. The power emulator executes an executable file of the mobile application to generate hardware usage statistics based on the sensor usage trace and the device usage trace. And the power impact estimator computes an increase in power consumption of the mobile application based on the hardware usage statistics.

26 Claims, 8 Drawing Sheets

(51) Int. Cl.
| | |
|---|---|
| G06F 1/3206 | (2019.01) |
| G01R 31/28 | (2006.01) |
| G06F 1/20 | (2006.01) |
| G06F 11/36 | (2006.01) |
| G06F 1/16 | (2006.01) |
| G06F 1/3215 | (2019.01) |
| G06F 9/48 | (2006.01) |
| G06F 1/3203 | (2019.01) |
| H04M 1/725 | (2021.01) |
| G06F 1/26 | (2006.01) |

(52) U.S. Cl.
CPC ............ G06F 1/1698 (2013.01); G06F 1/206 (2013.01); G06F 1/3203 (2013.01); G06F 1/3206 (2013.01); G06F 1/3215 (2013.01); G06F 9/4893 (2013.01); G06F 11/3644 (2013.01); G06F 1/26 (2013.01); H04M 1/72522 (2013.01); Y02D 10/00 (2018.01)

(58) Field of Classification Search
CPC ...... G06F 1/3203; G06F 1/3206; G06F 1/206; G06F 11/3644; G01R 31/2875; H04M 1/72522; Y02D 10/34
USPC ........................................................ 713/300
See application file for complete search history.

(56) References Cited

U.S. PATENT DOCUMENTS

| | | | | |
|---|---|---|---|---|
| 2013/0046967 | A1* | 2/2013 | Fullerton | ............. H03K 3/0315 713/100 |
| 2014/0082384 | A1* | 3/2014 | De Cesare | ............ G06F 1/3206 713/320 |
| 2014/0121557 | A1* | 5/2014 | Gannon | .................. A61B 5/002 600/549 |
| 2014/0289543 | A1* | 9/2014 | Flores Assad | .......... G06F 1/329 713/320 |
| 2014/0317427 | A1* | 10/2014 | Hill | ........................ G06F 1/3206 713/322 |
| 2015/0017965 | A1* | 1/2015 | Lim | .................. H04W 52/0258 455/418 |
| 2015/0084778 | A1* | 3/2015 | Mittal | .............. G01R 19/16542 340/636.16 |
| 2015/0095678 | A1* | 4/2015 | Nachman | .............. G06F 1/3234 713/323 |
| 2016/0147284 | A1* | 5/2016 | Kim | ........................ G09G 3/20 713/320 |
| 2016/0291671 | A1* | 10/2016 | Rider | .................. H04L 12/2827 |

FOREIGN PATENT DOCUMENTS

| | | |
|---|---|---|
| KR | 10-2012-0100146 A | 9/2012 |
| KR | 10-2014-0051717 A | 5/2014 |

OTHER PUBLICATIONS

Min, Chul Hong et al., "PowerForecaster: Predicting Smartphone Power Impact of Continuous Sensing Applications at Pare-Installation Time," GetMobile, vol. 20, No. 1, pp. 30-33, Jan. 2016.
Jeon, Jae Hong et al., "Development of Bench Mark Test Model to Evaluate Power Consumption of Mobile Context-Aware Applications," Proceedings of Korean Institute of Information Scientists and Engineers Conference, pp. 427-429, Jun. 2015. (See pp. 428-429 and table 1).
International Search Report (ISR) (English Language) for International Application PCT/KR2017/002548 (dated Jun. 16, 2017)).
Written Opinion of the International Searching Authority for International Application PCT/KR2017/002548 (dated Jun. 16, 2017).

* cited by examiner

| Sensor Type | Sensor Data | Related System Call | Related System Event |
|---|---|---|---|
| GPS | *longitude, latitude, altitude, speed, bearing* | gps_start(), gps_stop(), ... | GPS_EVENT_STARTED, GPS_EVENT_STOPPED, |
| Bluetooth | *name, address, bond state, type, UUIDs, RSSI* | startDiscoveryNative(), stopDiscoveryNative(), ... | ACTION_FOUND, ACTION_DISCOVERY _STARTED/_FINISHED |
| Wi-Fi | *BSSID, SSID, capabilities, frequency, level* | scan(), wifi_ctrl_recv() | SCAN_RESULTS _AVAILABLE_ACTION |
| Other sensors (accel, gyro, ...) | *values* | enableSensor(), disableSensor() | |

FIG. 2

| Resource type | Request APIs | Parameters |
|---|---|---|
| CPU | *acquire()* / *release()* on WakeLock | timeout, ref. count |
| | *setRepeating()* / *cancel()* on AlarmManager | alarm type, trigger time, trigger interval |
| GPS | *requestLocationUpdates()* / *removeLocationUpdates()* on LocationManager | provider, minDelay, minDistance, criteria |
| Bluetooth | *startDiscovery()* / *stopDiscovery()* on BluetoothAdapter | |
| Other sensors (Accel., Gyro, ...) | *registerListener()* / *unregisterListener()* on SensorManager | sensor type, sampling rate |

COMMUNICATION DEVICE FOR PREDICTING POWER CONSUMPTION OF MOBILE APPLICATION, COMMUNICATION SYSTEM INCLUDING SAME, METHOD OF PREDICTING POWER CONSUMPTION OF MOBILE APPLICATION AND METHOD OF PROVIDING PREDICTED POWER CONSUMPTION OF MOBILE APPLICATION, USING SAME

BACKGROUND

1. Field of Invention

The present invention relates to a communication device for predicting power consumption of mobile application, communication system including the same, method of predicting power consumption of mobile application using the same, and method of providing predicted power consumption using the same. More particularly, the present invention relates to a communication device for estimating power use of mobile application prior to installation of mobile application, communication system including the same, method of estimating power use of mobile application using the same, and method of providing estimated power use using the same.

2. Description of Related Art

Currently, the smartphone application market provides various information such as application features, screen shots, and user reviews to enable users to select applications that they want.

However, the smartphone application market does not provide application's power consumption which is one of the important information. Problematically, users find out how much power an application uses or consumes (or whether too much power is being consumed) only after installing and using it. Users rely on perception, which is based on such experience as above, to decide whether or not to continue using an application or how long they would use it.

Moreover, continuously sensing applications make such experience-based power control more difficult. The continuously sensing applications are installed and constantly use up battery (power) in the background, and this is problematic in that users do not become clearly aware of it.

SUMMARY

Technical Problem

To solve such problems as above, an object of the present invention is to provide a communication device for predicting power consumption of mobile application prior to installation of the mobile application.

Another object is to provide a communication system including the communication device.

Another object is to provide a method of predicting power consumption of mobile application using the communication device.

Another object is to provide a method of providing predicted power consumption using the communication device.

Solution to Problem

To attain such objects as above, a communication device according to an embodiment of the present invention may comprise a user trace manager, a power emulator, and a power impact estimator. The user trace manager may manage a user's sensor usage trace and device usage trace, which shows the user's mobile device usage pattern. The power emulator may execute an executable file of a mobile application to generate hardware usage statistics based on the sensor usage trace and the device usage trace. And the power impact estimator may compute an increase in power consumption of the mobile application based on the hardware usage statistics.

According to an embodiment, the sensor usage trace may be collected from a sensor of the mobile device used by the user.

According to an embodiment, the sensor usage trace may comprise at least one of a sensor data, sensed by the sensor of the mobile device; a system event of an operating system associated with the sensor data; and a system call of the operating system associated with the sensor data.

According to an embodiment, the device usage trace may indicate device-sharing effect of the mobile application and at least one other mobile application.

According to an embodiment, the device usage trace may comprise an API (application programming interface) call of the mobile device, and a parameter associated with the API call.

According to an embodiment, the mobile application may be a sensing application continuously operating in background of the mobile device.

According to an embodiment, the power emulator may comprise: a plurality of emulator instances, executing parallel emulation; and an emulator manager, receiving the sensor usage trace and the device usage trace from the user trace manager and providing the traces to the emulator instances, and receiving hardware usage statistics from the emulator instances.

According to an embodiment, the emulator manager may divide the sensor usage trace into a plurality of sensor trace segments and assigns the sensor trace segments to the emulator instances.

According to an embodiment, the emulator manager may aggregate hardware usage statistics segments generated in the emulator instances based on the sensor trace segments.

According to an embodiment, the emulator manager may divide the device usage trace into a plurality of device trace segments and assigns the device trace segments to the emulator instances.

According to an embodiment, the emulator instance may comprise: a sensor emulator, responding to a request by the mobile application and mimicking operation of the sensor of the mobile device based on the sensor usage trace; a device usage replayer, reflecting device-sharing effect of the mobile application and at least one other mobile application based on the device usage trace; and a hardware usage monitor, collecting the hardware usage statistics.

According to an embodiment, the sensor emulator may perform sampling of sensor data in the sensor usage trace in accordance with a sensing rate demanded by the mobile application.

According to an embodiment, interpolation may be performed on adjacent sensor data in the sensor usage trace to provide data demanded by the mobile application.

According to an embodiment, the emulator instance may further comprise a time accelerator, skipping idle time of the sensor usage trace during operation of the sensor emulator, to reduce operation time of the power emulator.

According to an embodiment, the time accelerator may determine the idle time of the sensor usage trace from a power manager of an operating system, which manages wakelocks.

According to an embodiment, the time accelerator may determine a start of the idle time when the wakelocks are all released.

According to an embodiment, the power impact estimator may compute a net power increase of the mobile application, and the net power increase may be obtained by deducting a power consumption estimate value when the mobile application is not running from a power consumption estimate value when the mobile application is running.

According to an embodiment, the power consumption estimate value may use a finite state machine model of a hardware when the mobile application is running.

According to an embodiment of the present invention, a communication system may comprise a mobile device of a user and a server device: the mobile device of the user, performing a mobile application and comprising a sensor trace collector, collecting sensor usage trace of the user, and a device trace collector, collecting device usage trace indicating usage pattern of the mobile device of the user; and the server device comprising: a user trace manager, managing the sensor usage trace and the device usage trace; a power emulator, executing an executable file of the mobile application and generating hardware usage statistics based on the sensor usage trace and the device usage trace; and a power impact estimator, computing an increase in power consumption based on the hardware usage statistics.

According to an embodiment, the sensor usage trace may be collected from a sensor of the mobile device.

According to an embodiment, the device usage trace may indicate device-sharing effect of the mobile application and at least one other mobile application.

According to an embodiment of the present invention, a method of predicting power consumption of a mobile application may comprise: a step of collecting a user's sensor usage trace and device usage trace showing the user's usage pattern of the user's mobile device; a step of executing an executable file of the mobile application and generating hardware usage statistics based on the sensor usage trace and the device usage trace; and a step of computing an increase in power consumption of the mobile application based on the hardware usage statistics.

According to an embodiment, the sensor usage trace may be collected from a sensor of the mobile device.

According to an embodiment, the device usage trace may indicate device-sharing effect of the mobile application and at least one other mobile application.

According to an embodiment, the step of generating the hardware usage statistics may comprise: a step of receiving the sensor usage trace and the device usage trace from the mobile device; a step of initiating a plurality of emulator instances; a step of installing the mobile application in the plurality of emulator instances; and a step of generating the hardware usage statistic by executing executable files of the mobile application in the emulator instances.

According to an embodiment, the step of generating the hardware usage statistics may further comprise a step of dividing the device usage trace into a plurality of sensor trace segments and assigning the trace segments to the emulator instances.

According to an embodiment, the step of generating the hardware usage statistics may further comprise a step of aggregating hardware usage statistics segments generated in the emulator instances based on the divided sensor trace segments.

According to an embodiment of the present invention, a method of providing estimated power use of a mobile application may comprise: collecting a user's sensor usage trace and device usage trace reflecting the user's mobile device usage pattern; generating hardware usage statistics based on the sensor usage trace and the device usage trace by executing an executable file of a mobile application; computing an increase in power use of the mobile application based on the hardware usage statistics; determining a decrease in operation time of the mobile device based on the increase in power use, when the mobile application is executed; and displaying the decrease in operation time in a display unit of the mobile device.

According to an embodiment, the increase in power use of the mobile application may be an increase in power use during weekdays and an increase in power use during a weekend.

According to an embodiment, the decrease in operation time may be a decrease in operation time during the weekdays and a decrease in operation time during the weekend.

Advantageous Effects

According to such embodiments of the present invention as above, a communication device, communication system, and method of predicting power consumption of mobile application, and a method of providing predicted power consumption, may provide instantaneous and personalized power consumption predictions prior to installation of mobile application.

That is, in the present invention, each user's experience may be reflected on/regarding power consumption predictions of mobile application.

First, the inconvenience of a user having to install mobile applications one by one until the user finds a power-efficient application may be eliminated, as power consumption predictions in the present invention are provided prior to installation of mobile application.

Second, power consumption predictions may be provided with high accuracy, as power consumption predictions in the present invention are very individualized/personalized (so as) to reflect a user's physical activities and mobile-device usage patterns, Third, the present invention may be applied to various mobile applications, as power consumption predictions of mobile application may be made without modification/alteration of mobile application or additional information request from the mobile application developer.

BRIEF DESCRIPTION OF THE DRAWINGS

FIG. 2 is a table showing sensor usage trace, which is collected at the sensor trace collector of FIG. 1.

FIG. 3 is a table showing device usage trace, which is collected at the device trace collector of FIG. 1.

DETAILED DESCRIPTION

Figure 1:
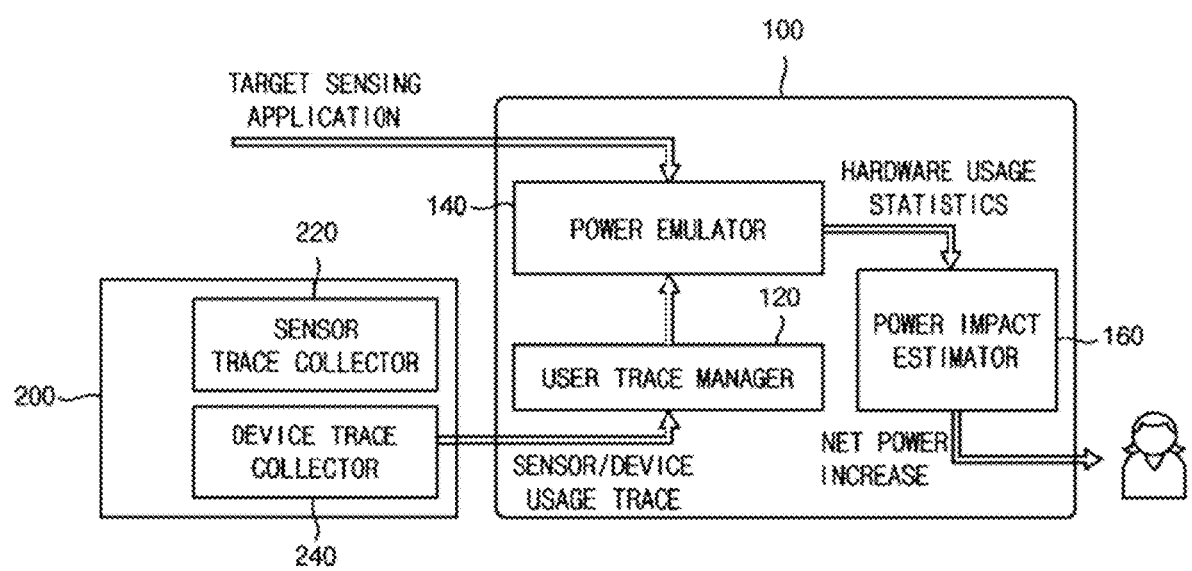
FIG. 1 is a block diagram showing a communication system, according to an embodiment of the present invention.

Hereinafter, various embodiments of the present invention are shown and described. These embodiments are used and describe and convey to a person skilled in the art, particular structural, configurational and/or functional, operational aspects of the invention and should be interpreted as such. The present invention may be altered/modified and embodied in various other forms and thus, is not limited to any of the embodiments set forth.

The present invention should be interpreted to include all alterations/modifications, substitutes, and equivalents that are within the spirit and technical scope of the present invention.

Terms such as "first," "second," "third," etc. herein may be used to describe various elements and/or parts but the elements and/or parts should not be limited by these terms. These terms are used only to distinguish one element and/or part from another. For instance, a first element may be termed a second element and vice versa, without departing from the spirit and scope of the present invention.

When one element is described as being "joined" or "connected" etc. to another element, the one element may be interpreted as "joined" or "connected" to that another element directly or indirectly via a third element, unless the language clearly specifies. Likewise, such language as "between," "immediately between," "neighboring," "directly neighboring" etc. should be interpreted as such.

Terminology used herein is for the purpose of describing particular exemplary embodiments only and is not intended to limit the present invention. As used herein, singular forms (e.g., "a," "an") include the plural forms as well, unless the context clearly indicates otherwise. The language "comprises," "comprising," "including," "having," etc. are intended to indicate the presence of described features, numbers, steps, operations, elements, and/or components, and should not be interpreted as precluding the presence or addition of one or more of other features, numbers, steps, operations, elements, and/or components, and/or grouping thereof.

Unless otherwise defined, all terms (including technical and scientific terms) used herein have same meaning as those commonly understood by a person with ordinary skill in the art to which the present invention pertains. Terms, such as those defined in commonly used dictionaries, should be interpreted as having meaning that is consistent with their meaning in the context of the relevant art and should not be interpreted in an idealized or overly formal sense unless expressly so defined herein.

Hereafter, various embodiments of the present invention are described in more detail with reference to the accompanying drawings. Same reference numerals are used for the same elements in the drawings, and duplicate descriptions are omitted for the same elements or features.

FIG. 1 is a block diagram showing a communication system, according to an embodiment of the present invention. FIG. 2 is a table showing sensor usage trace, which is collected at the sensor trace collector of FIG. 1. FIG. 3 is a table showing device usage trace, which is collected at the device trace collector of FIG. 1.

Referencing FIG. 1-FIG. 3, the system for predicting power consumption of mobile application comprises a communication device (100) and a mobile device (200) of a user.

In the communication system, a trace-based emulation method is used to estimate and predict power use or consumption of a mobile application.

Sensor usage and device usage traces are pre-collected by the mobile device (200) of a user. The sensor usage trace may reflect physical situations, conditions, or circumstances of the user. The device usage trace may show mobile device usage pattern of the user. The user's physical situations may include information as to e.g., physical activities and behavior of the user, as well as location related to indoor/outdoor conditions or circumstances the user, regarding movements of the user.

A power emulator is configured to determine the expected power consumption of the mobile application. The power emulator executes or runs a target mobile application over the sensor usage trace and tracks changes in power state/status of (essential) hardware elements or components. The power emulator maps each hardware component's power status as a power number and aggregates the power numbers to compute total power consumption.

Also, the power emulator may track another/other application(s) to estimate and predict a more accurate net power (e.g., use or increase), by replaying the device usage trace.

The communication device (100) comprises a user trace manager (120), a power emulator (140), and a power impact estimator (160). The communication device (100) may, for example, be a server or a cloud server device.

The mobile device (200) comprises a sensor trace collector (220) and a device trace collector (240). The mobile device (200) may, for example, be portable device such as a mobile phone, tablet PC, notebook computer, netbook, and PDA. The mobile device (200) may comprise an internal sensor.

The communication device (100) receives as input, executable files of a target mobile application, generates as output, an estimate of a net power increase of/in the target mobile application. The estimate of the net power increase may be personalized according to the user's physical activities and usage pattern of the mobile device (200).

The target mobile application may, for example, be a sensing application, which continuously operates in the background of the mobile device (200).

The user trace manager (120) manages the sensor usage trace, which reflects the user's physical situations, and the device usage trace, which shows the user's usage pattern of the mobile device (200).

The sensor usage trace may be collected from a sensor in the mobile device (200), which is used by the user. The sensor usage trace may include at least one of sensor data sensed by the sensor in the mobile device (200), system event and system call of an operating system related to or associated with the sensor data. As shown in FIG. 2, the sensor usage trace may include "Sensor Data" sensed by the sensor of the mobile device (200) and "System Call" and "System Event" of an operating system related to the sensor data.

When the sensor is, for example, a GPS, the sensor data may be longitude, latitude, altitude, speed, bearing, etc. In this case, the system event may be GPS_EVENT_STARTED, GPS_EVENT_STOPPTED, etc., and the system call, gps_start( ), gps_stop( ) etc.

When the sensor is a Bluetooth, the sensor data may be name, address, bond state, type, UUIDs, RSSI etc. In this case, the system event may be ACTION_FOUND, ACTION_DISCOVERY_STARTED, ACTION_DISCOVERY_FINISHED, etc., and the system call, startDiscoveryNative( ) stopDiscoveryNative( ) etc.

The device usage trace may show sharing effects of the mobile application and other mobile applications. As shown in FIG. 3, the device usage trace may include API(application programming interface) call of the mobile device (200) and parameters associated with the API call.

When resource type of the mobile device (200) is, for example, CPU, the API call may be acquire( )/release( ) executed at WakeLock. In this case, parameters associated with the API call may be timeout, ref count, etc.

When resource type of the mobile device (200) is, for example, CPU, the API call may be setRepeating( )/cancel( ) executed at AlarmManager. In this case, parameters associated with the API call may be alarm type, trigger time, trigger interval, etc.

When resource type of the mobile device (200) is, for example, GPS, the API call may be requestLocationUpates ( )/removeLocationUpdates( ) executed at LocationManager. In this case, the parameters associated with the API call may be provider, minDelay, minDistance, criteria, etc.

The sensor trace collector (220) collects the sensor usage trace. The sensor trace collector (220) delivers/forwards the sensor usage trace to the user trace manager (120).

The device trace collector (240) collects the device usage trace. The device trace collector (240) delivers/forwards the device usage trace to the user trace manager (120).

The device trace collector (240) device reflects sharing effects of/with the target mobile application and (of/with) other applications already running.

To determine an accurate power consumption of the target mobile application, there is a need to determine resource sharing state/status of/with other applications. For this, the target mobile application and other applications may be executed or run at a same time. However, when running multiple applications simultaneously as such, there is a need for complex calculation. Accordingly, the device trace collector (240) only records device usage traces of the running applications to estimate and predict sharing effects of a plurality of applications. Therefore, in the present system, sharing effects of hardware may be computed (comparatively) accurately without a need to actually run a plurality of applications.

So as not to interfere with ordinary, everyday use of the mobile device (200) by the user, the sensor usage and device usage traces may be uploaded to the server device (100) (only) when the mobile device (200) is in a Wi-Fi area and/or while the mobile device (200) is charging.

The user trace manager (120) delivers/forwards the sensor usage and device usage traces to the power emulator (140).

The power emulator (140) runs executable files of the mobile application to generate hardware usage statistics based on the sensor usage and device usage traces.

Upon a power estimation or prediction request, the power emulator (140) runs the executable files of the target mobile application and monitors hardware usage of the target mobile application. At the same time, the power emulator (140) replays the sensor usage and device usage traces to reproduce running environment which may affect power (consumption) of the mobile application.

As a result, the power emulator (140) obtains or acquires detailed hardware usage statistics on e.g., when, for how long, how much, and which hardware consumed power. Operation of the power emulator (140) is described in detail later with reference to FIG. 4 and FIG. 5.

The power impact estimator (160) computes an increase in power consumption of the mobile application based on the hardware usage statistics aggregated. For example, the power impact estimator (160) may compute a net increase in power consumption by the mobile application.

A hardware element or component of which the power consumption is tracked may be a hardware component which is commonly used by sensing applications. For example, the hardware component power of which the power consumption is tracked may be an inertial sensor, GPS, Bluetooth, Wi-Fi, microphone, and CPU, etc. The hardware component may further include display unit, network unit, and GPU, etc.

Figure 4:
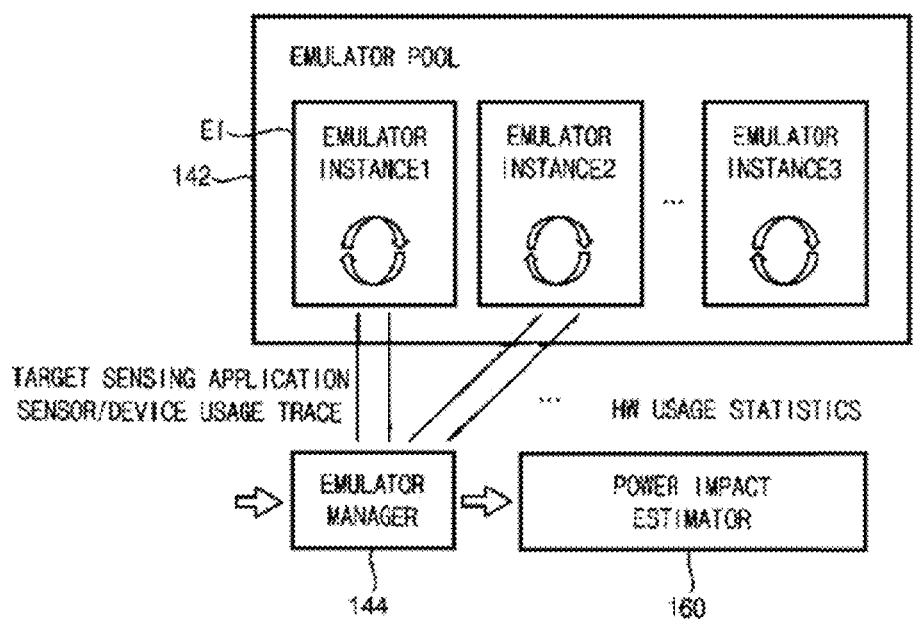
FIG. 4 is a block diagram of the power emulator of FIG. 1.
Figure 5:
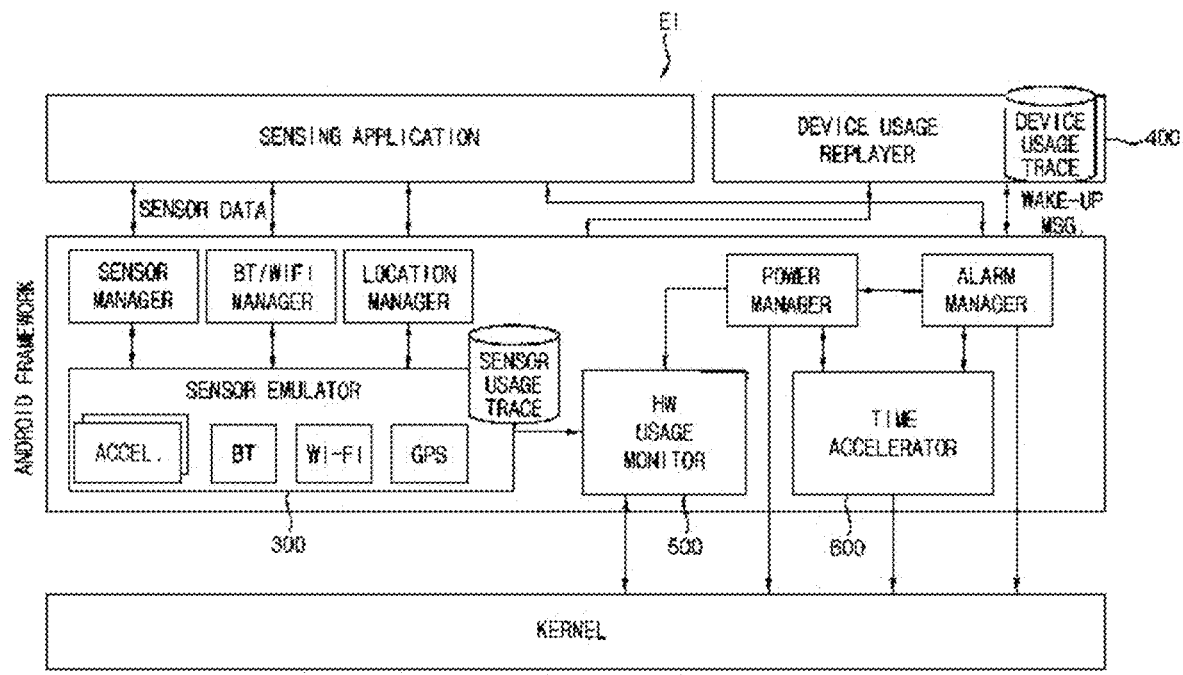
FIG. 5 is a block diagram of the power emulator instance of FIG. 4.
Figure 6A:
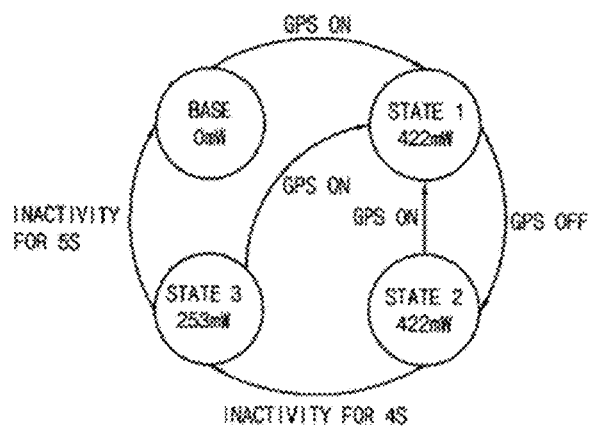
FIG. 6A is a concept diagram showing operation of the power impact estimator (of FIG. 4), which predicts power consumption of GPS.
Figure 6B:
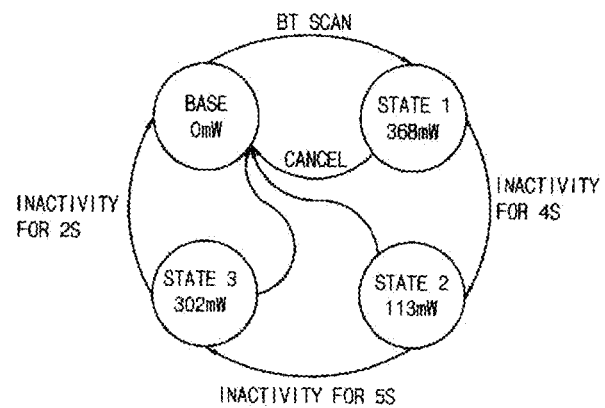
FIG. 6B is a concept diagram showing operation of the power impact estimator (of FIG. 4), which predicts power consumption of Bluetooth.

FIG. 4 is a block diagram of the power emulator of FIG. 1. FIG. 5 is a block diagram of the power emulator instance of FIG. 4. FIG. 6A is a concept diagram showing operation of the power impact estimator (of FIG. 4), which predicts power consumption of GPS; FIG. 6B is a concept diagram showing operation of the power impact estimator (of FIG. 4), which predicts power consumption of Bluetooth.

Referencing FIG. 1 through FIG. 6A/6B, the power emulator (140) comprises an emulator pool (142), which includes a plurality of emulator instances (EI's), and an emulator manager (144).

The plurality of emulator instances (EI's) may perform parallel emulation.

The emulator manager (144) receives the sensor usage and device usage traces from the user trace manager (120) and provide the plurality of emulation instances (EI's) and receives hardware usage statistics from the emulations instances (EI's).

The emulator manager (144) may divide the sensor usage trace into a plurality of sensor trace segments and assign the sensor trace segments to the emulator instances (EI's).

The emulator manager (144) may divide the device usage trace into a plurality of device trace segments and assign the device trace segments to the emulator instances (EI's).

The emulator manger (144) may aggregate hardware usage statistics segments generated in the emulator instances (EI's), based on the assigned sensor trace segments.

The emulator instance (EI) comprises a sensor emulator (300), a device usage replayer (400), and a hardware usage monitor (500).

The sensor emulator (300) responds to a request by the mobile application and mimics operation the sensor of the mobile device (200), based on the sensor usage trace.

The device usage replayer (400) reflects device sharing effects of the mobile application and other mobile applications, based on the device usage trace. The device usage replayer (400) reproduces a situation similar to the emulator instances (EI's) running multiple applications simultaneously at a same time, based on the device usage trace.

The hardware usage monitor (500) collects the hardware usage statistics.

Power emulation process is performed according to three stages: a pre-emulation stage, a power emulation stage, and a post-emulation stage.

In the pre-emulation stage, the emulator manager (144) prepares inputs necessary for emulation upon a request. The emulator manager (144) first receives the sensor usage and device usage traces from user trace manager (120). Also, the emulator manager (144) receives the executable files of the target sensing application. The emulator manager (144) initiates emulator instances (EI's) operating in parallel to prevent/reduce latency in delay in power consumption estimation or prediction. Each of the emulator instances (EI's) installs a target sensing application and receives a part of the sensor usage and device usage traces from the emulator manager (144). The emulator instances (EI's) may reproduce user interaction(s), as necessary, prior to running the target sensing application. The user interaction may, for example, be clicking of a start button for bootstrapping the target sensing application. Also, the emulator instances (EI's) may adjust a system clock for synchronizing time with the traces.

When the preparation stage ends, the emulator instances (EI's) run the target sensing application in the power emulation stage. When the target sensing application is running, the sensor emulator (300) uses the pre-collected sensor usage trace to mimic operation of sensors according to sensor use requests of the target sensing application. To consider device sharing effects with other applications, the device usage replayer (400) uses the pre-collected device usage trace to reproduce device use situation of applications running. Because of this, the target sensing application reproduces a situation similar to the target sensing application running along with other applications. When the target sensing application is running, the hardware usage monitor (500) tracks system calls made to use hardware components such as a sensor and CPU. At the end, the hardware usage monitor (500) generates the hardware usage statistics. The hardware usage statistics may include system calls executed when the target sensing application is running and corresponding timestamps.

In the post-emulation stage, the power impact estimator (160) uses the collected hardware usage statistics to compute a net increase in power consumption of the target sensing application. For power use or consumption estimation, the power impact estimator (160) adopts and uses a system-call based method, which uses power profiles obtained by offline profiling. The power impact estimator (160) considers hardware components mainly used by sensing applications, including a CPU, GPS, inertial sensor, microphone, Bluetooth, and Wi-Fi, etc.

The sensor emulator (300) reproduces the physical situations, conditions, or circumstances (e.g., physical behavior conditions) of the user by providing the sensor usage trace of the user to the target sensing application. For realistic emulation, the sensor emulator (300) may feed sensor data at accurate timing and rate as the target sensing application demands. The sensor emulator (300) may also emulate hardware states or conditions of corresponding or applicable sensors (or sensor devices).

The sensor emulator (300) mimics real/actual sensor device (or sensor devices') operation and state or condition. First, the sensor emulator (300) provides the collected sensor data to the target sensing application according to a request by the target sensing application. Second, the sensor emulator (300) reproduces or replays sensor-related system events for proper, accurate operation of the target sensing application. Third, the sensor emulator (300) tracks changes in power state or condition of the sensor device based on sensor-related system call and callback logs to and from the kernel.

The sensor emulator (300) may be positioned and located between Android framework and the kernel. The Android framework receives sensor data requests from a plurality of applications and interacts with the kernel. The sensor emulator (300) hooks/acquires the sensor-related system calls from the framework to the kernel and provides sensor data using the trace collected.

When the sensor is, for example, an accelerometer, the sensor emulator (300) hooks/acquires all sensor activation and deactivation requests from (the) Android SensorManager to the kernel. To handle the activation request(s), the sensor emulator (300) searches for sensor data corresponding to the request time in/from the collected trace and provides the sensor data to the target sensing application. Also, the sensor emulator (300) may perform a data sampling of the sensor data in the sensor usage trace to meet a sensing rate requested/required by the target sensing application.

When the sensor is, for example, a GPS, the sensor emulator (300) hooks/acquires GPS requests from the Android LocationManager to the kernel. To handle the GPS request(s), the sensor emulator (300) searches for GPS data corresponding to the request time in/from the collected sensor usage trace and provides the GPS data to the target sensing application. Even with same request, it is important to consider the real activation time in a user's real situation, as the activation time may be vary depending on the user situation or environment (e.g., indoor or outdoor). The user environment may affect execution of the target sensing application and power consumption of the GPS (device). When a GPS request interval of the target sensing application is different from a GPS request interval of the collected sensor usage trace, GPS data exactly matching or corresponding to the request time may not be searched and found. In such case, the sensor emulator (300) may interpolate the GPS data based on adjacent GPS data logs.

The device usage replayer (400) reproduces the user's usage pattern of the mobile device (200) to reflect power sharing effects between/among applications in (the) power emulation. The device usage replayer (400) may, for example, run in the background (as an Android service) simultaneously with the target sensing application. As shown in FIG. 3, the collected device usage trace may include a list of timestamped elements (for example, timestamp, API function, parameter values, etc.). Based on the timestamp, the device usage replayer (400) may call the API with the parameter values.

API calls to access the hardware components may (generally) operate as a pair. The API call may, for example, be acquire( ) and release( ) For accurate power estimation and prediction, both of the API calls in the pair may be needed. One API call in the pair may be omitted at times because of duty cycle data collection or the segmentation of the device usage trace for parallel execution (described later). For example, when there is only the API call release( ) and not acquire( ) in the collected device usage trace, the device usage replayer (400) may fill and add acquire( ) and set the timestamp to a beginning of the trace.

During the power emulation, the hardware usage monitor (500) collects the hardware usage statistics. The hardware usage monitor (500) may, for example, collect system calls made by the framework, and timestamps of the system calls. The sensor-related system calls are captured and collected in the sensor emulator (300).

To compute power use or consumption of CPU, the hardware usage monitor (500) may, for example, make wakelock requests, such as acquire_wake_lock( ) and release_wake_lock( ) from the Android PowerManager to the kernel. The hardware usage monitor (500) may obtain details and history of CPU utilization of the target sensing application from an acquire request (time) until a release request (time).

After the power emulation, the power impact estimator (160) computes a net power increase (netPapp) based on the hardware usage statistics. The net power increase netPapp may be computed using Equation 1 below:

$$netPapp = P^D{\rm with\_app}\ P^D{\rm without\_app} \qquad [{\rm Equation\ 1}]$$

Here, D is the set of hardware components the target sensing application uses. $P^D$with_app and $P^D$without_app are the power consumption of D, when the targeting sensing application is running and not running, respectively. As described earlier, the hardware component may be a CPU, GPU, Bluetooth, Wi-Fi, microphone, accelerometer, gyroscope, and magnetometer.

Power used or consumed by the hardware components is estimated based on a system call based method. In FIG. 6A, a finite state machine (FSM) based power model is shown. In FIG. 6B, a finite state machine based power model is shown as to a Bluetooth. Also, a finite machine power model of an entire device may be generated by considering hardware sharing effects of the system calls. By using the finite state machine based power model, power state of the hardware components and hardware sharing effects according to the system calls may be determined. Power state of the hardware component according to each system call may be profiled with a power measurement device to generate the power model. For example, $P^D$with_app may be computed by using the finite state machine and hardware usage statistics, and $P^D$without_app may be computed using a similar method by using the hardware usage statistics after reproducing the device usage trace.

Figure 7:
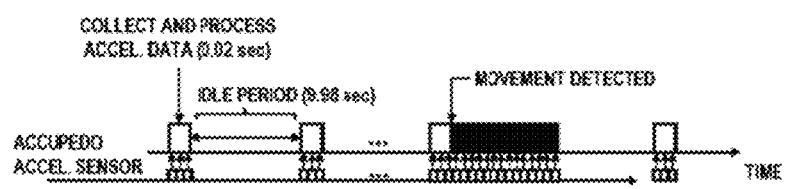
FIG. 7 is a concept diagram showing an exemplary sensing cycle/period of a sensing application.
Figure 8:
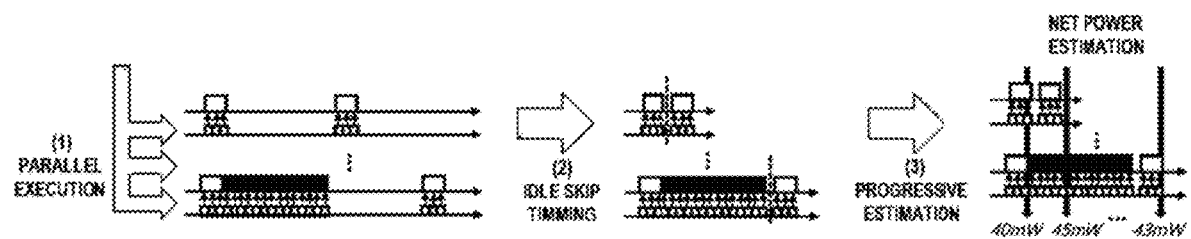
FIG. 8 is a concept diagram showing a method of performing parallel emulation on sensing data of the sensing application of FIG. 7 at the power emulator of FIG. 1.
Figure 9:
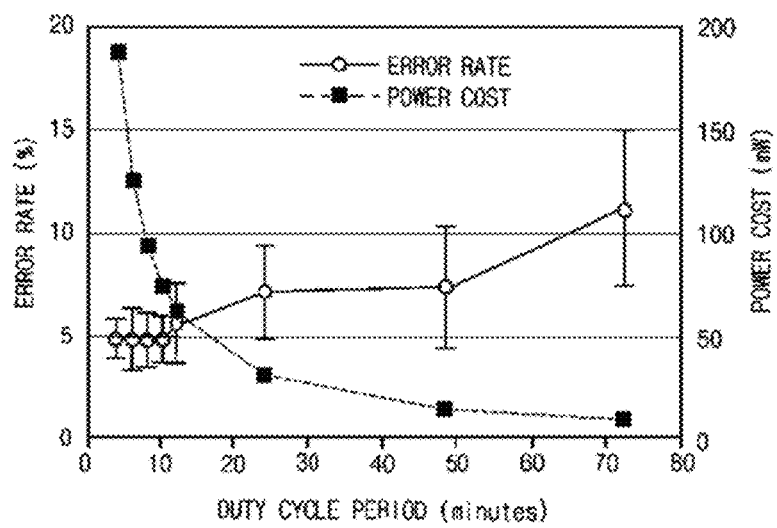
FIG. 9 is a concept diagram showing a method of the sensor trace collector of FIG. 1 using a duty cycle method to reduce power consumption.

FIG. 7 is a concept diagram showing an exemplary sensing cycle/period of a sensing application. FIG. 8 is a concept diagram showing a method of performing parallel emulation on sensing data of the sensing application of FIG. 7 at the power emulator of FIG. 1. FIG. 9 is a concept diagram showing a method of the sensor trace collector of FIG. 1 using a duty cycle method to reduce power consumption.

Referencing FIG. 7-FIG. 9, optimization of the present communication system is described. The communication system may (need to) be optimized to accelerate the power emulation and to power-efficiently collect the sensor usage and device usage traces.

First, for a reliable power estimation or prediction, a trace of the user's physical activities may need to be long enough; however, when the trace is long, the emulation may take too much time. Generally, the emulation may take as much time as a time-length of the trace. When considering multiple users, multiple sensing applications, and version updating of the sensing applications, as well as a combination thereof, the emulation time/period may need to be reduced to be shorter than the length of the traces. The present communication system may perform fast emulation through fast-forwarding replay and parallelizing replay. The fast-forwarding replay may apply a method of capturing changes in power states, and the parallelizing replay, a method of using the plurality of emulator instances (EI's).

Second, nontrivial power overhead is incurred in collecting the sensor usage trace from the user's mobile device (200). To minimize necessary data collection while maintaining high accuracy in the power consumption estimation or prediction, a balanced duty-cycling (policy) may be applied in the present communication system. The user need not collect sensor usage trace redundantly for operation of diverse sensing applications. Trace reflecting the user's physical situations may be collected for a day or two and reused afterwards.

A key problem in emulation-based power consumption estimation or prediction may be reducing execution time. Different from ordinary applications, (the) sensing applications operate closely tied to real-time clocks. The sensing applications are governed or greatly affected by sampling rate, sampling interval, and time window for data processing.

In the present communication system, the emulation time may be reduced by using three acceleration methods/techniques: parallel execution, idle time skipping, and progressive estimation.

In FIG. 7-FIG. 8, parallel execution, idle time skipping and progressive estimation are shown for a pedometer application, "Accupedo." A unique characteristic of a continuous sensing application is that the sensing application operates by repeating cycle. The continuous sensing application performs certain operation in a cycle (e.g., stateful), but does not perform any there between (e.g., stateless). Such characteristic may enable parallel emulation. Another unique characteristic of a continuous sensing application is that the sensing application wakes up the sensor device as little as possible to save power or energy. Active period of the sensor device by the sensing application is much shorter than idle period. For example, Accupedo wakes up every 10 sec to detect the user's movement with 20-ms accelerometer data and goes to sleep again when there is no user movement.

In the parallel execution method, the emulator manager (144) splits and divides input trace of (relatively) long length into relatively short or shorter segments. For example, the emulator manager (144) may split and divide the input trace into 2-minute units. The emulator manager (144) assigns (each of) the divided segments to each of the emulator instances (EI's). Each emulator instance (EI) reproduces the divided and assigned sensor usage and device usage traces and independently executes or runs the target sensing application. When the target sensing application execution is complete, the hardware usage statistics from each of the emulator instances (EI's) are aggregated for overall, total power consumption estimation or prediction.

A practical issue in parallel execution is determining a proper length or size for the segment. On one hand, the size may need to be short enough to exploit the advantages/effects of parallelism, while on the other, long enough to include in a cycle of the sensing application. Ideally, a proper segment size varies depending on each application's internal logic. Considering an application that detects a conversation partner every 2 minutes via Bluetooth scan, the ideal segment size may be 2 minutes. Naturally, if sensing applications' internal logics are not known in advance, finding or identifying a segment size for each sensing application may not be simple. In the present communication system, a same segment size may be used for all sensing applications. For example, the segment size may be 2 minutes, which shows reasonable accuracy level in most applications. Different from this, the segment size may, for example, be automatically determined by analyzing repeated resource usage patterns of the sensing application.

For the idle skipping time method, the emulator instance (EI) may further comprise a time accelerator (600). The time accelerator (600) may skip idle time of the sensor usage trace while the sensor emulator (300) is in operation, to reduce operation time of the power emulator (140).

The idle time may be defined as a period for which all CPU wakelock requests are released. The time accelerator (600) may determine start and end points of the idle time from the Android PowerManager. The Android PowerManager manages all wakelocks. The time accelerator (600) determines that the idle time starts when (detecting that) all of the wakelock are released. The time accelerator (600) scans alarm schedule in the Android AlarmManager until the very next alarm (e.g., the end point of the idle time). The time accelerator (600) may skip the idle time by setting the system clock to the end point of the idle time.

While the emulation time may be significantly reduced by using the methods described above, final emulation time may be bound and determined by a segment with longest execution time. The length of the execution time of the segment may vary by how much idle time may be skipped according to user behavior. For more responsive service or immediate result, the progressive estimation method may be used. In the progressive estimation method, the net power increase is estimated by using interim emulation results during the emulation; the net power increase is progressively updated. The progressive estimation method reduces the first response time to the user.

The sensor trace collector (220) and the device trace collector (240) collect the sensor usage trace and the device usage trace, respectively, for power estimation or prediction of a target sensing application to be executed later in future (e.g., future sensing applications). The trace collection may be performed over a period of only a day or two to reflect the user's behaviors. To increase trace efficiency, sensor data may need to be collected at highest rate as possible, and there may be a problem with power consumptions of the sensor trace collector (220) and the device trace collector (240).

In the present communication system, the duty cycling method of FIG. 9 may be used to reduce power of the sensor trace collector (220) and the device trace collector (240).

FIG. 9 shows (estimation) error rates and power consumptions at each duty cycle when duty cycling is not used to reduce power consumption. In FIG. 9, trace collection is performed for 2 minutes during a set time period. Accordingly, when the duty cycle is 4 minutes, the trace collection is performed for ½ the period, and when the duty cycle is 20 minutes, the trace collection is performed for 1/10 the period. When the duty cycle is 60 minutes, the trace collection is performed for 1/30 the period. The duty cycle may be appropriately set by comparing the error rates and the power consumptions.

Figure 10:
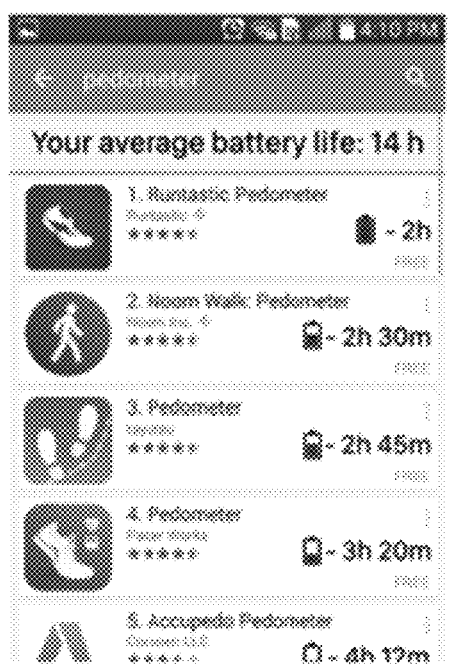
FIG. 10 and FIG. 11 are concept diagrams, each showing application market according to an embodiment of the present invention.
Figure 11:
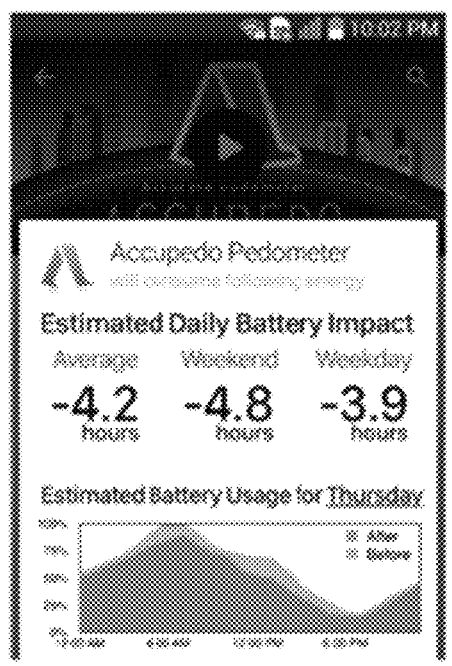

FIG. 10 and FIG. 11 are concept diagrams, each showing application market according to an embodiment of the present invention.

Referencing FIG. 10-FIG. 11, the application markets provide estimated power use or consumption of a target mobile application to a user. When so provided, the user will make a better decision as to whether or not to install an application, even without actually installing the application. The user will be saved from time-wasting, exhaustive trial-and-errors and make a sound, judicious decision as to install a certain application, and when ready to accept (the) expected battery consumption, the user need not be anxious of the rapid battery depletion.

According to an embodiment of the present invention, the method of providing estimated or predicted power use or consumption of a target mobile application comprises: a step of collecting sensor usage trace reflecting the user's physical situations, conditions, or circumstances and device usage trace showing the user's usage pattern of the user's mobile device; a step of generating hardware usage statistics based on the sensor usage trace and the device usage trace by executing an executable file of the target mobile application; a step of computing an increase in power consumption of the target mobile application based on the hardware usage statistics; a step of determining a decrease in operation time of the mobile device based on the increase in power consumption, when the target mobile application is executed; and a step of displaying the decrease in operation time in a display unit of the mobile device.

The increase in power consumption of the target mobile application may include increase in power consumption during weekdays and weekend, respectively. Likewise, the decrease in operation time may include decrease in operation time during the weekdays and weekend.

FIG. 10 shows an example of a display unit of the user's mobile device (200), in which the estimated power consumption is displayed. The display unit first displays the user's average battery life of 14 hours. In the display unit, each target sensing application's increase in power consumption is converted into and displayed as decrease in operation time.

As an example, in a case of a sensing application "Runtastic Pedometer," the operation time of the user's mobile device (200) is (shown to be) reduced by an average 2 hours. In a case of "NoomWalk: Pedometer," the operation time of the user's mobile device (200) is (shown to be) reduced by an average 2.5 hours.

In FIG. 11, when one application is selected, the application's detailed information screen is displayed. As an example, for "Accupedo Pedometer," the operation time of the user's mobile device (200) may be reduced by an average 4.2 hours. During weekdays, "Accupedo Pedometer" may reduce the operation time of the mobile device (200) by 3.9 hours during the weekdays and 4.8 hours during the weekend.

According to the present invention, an accurate, personalized power consumption estimation is possible by considering the user's physical activities and mobile device usage patterns and estimating and predicting power consumption of a target sensing application.

Also, because power consumption is verified prior to installation of a sensing application, unnecessary repetition of installation and deletion of applications may be prevented.

Also through parallel emulation, idle time skipping, and progressive estimation, emulation time may be reduced and the power consumption of the target sensing application may be quickly determined.

Also by using duty cycling method, power overhead of the trace collection in the mobile device may be reduced.

As disclosed above, the present invention has been shown and described by referencing exemplary embodiments as illustrative purpose, and a person having ordinary skill in the art will understand that the invention is not limited to a particular embodiment and that the present invention may be altered or modified in various ways without departing the spirit and scope of the present invention as recited in the accompanying claims and that such modifications are within the scope of the accompanying claims.

List of Reference Numerals

100: Communication Device
120: User Trace Manager
140: Power Emulator  142: Emulator Pool  144: Emulator Manager
160: Power Impact Estimator
200: Mobile Device  220: Sensor Trace Collector  240: Device Trace Collector
300: Sensor Emulator
400: Device Usage Replayer
500: Hardware Usage Monitor
600: Time Accelerator

What is claimed is:

1. A communication device, comprising:
a user trace manager, managing a user's sensor usage trace and device usage trace, which shows the user's mobile device usage pattern;
a power emulator, executing an executable file of a mobile application to generate hardware usage statistics based on the sensor usage trace and the device usage trace; and
a power impact estimator, computing an increase in power consumption of the mobile application based on the hardware usage statistics;
wherein the power emulator comprises:
a plurality of emulator instances, executing parallel emulation; and
an emulator manager, receiving the sensor usage trace and the device usage trace from the user trace manager and providing the traces to the emulator instances, and receiving hardware usage statistics from the emulator instances, and
the emulator instance comprises:
a sensor emulator, responding to a request by the mobile application and mimicking operation of a sensor of the mobile device based on the sensor usage trace;
a device usage replayer, reflecting device-sharing effect of the mobile application and at least one other mobile application based on the device usage trace; and
a hardware usage monitor, collecting the hardware usage statistics.

2. The communication device according to claim 1, wherein the sensor usage trace is collected from a sensor of the mobile device used by the user.

3. The communication device according to claim 2, wherein the sensor usage trace comprises at least one of:
a sensor data, sensed by the sensor of the mobile device;
a system event of an operating system associated with the sensor data; and
a system call of the operating system associated with the sensor data.

4. The communication device according to claim 1, wherein the device usage trace indicates device-sharing effect of the mobile application and at least one other mobile application.

5. The communication device according to claim 4, wherein the device usage trace comprises:
an API (application programming interface) call of the mobile device, and
a parameter associated with the API call.

6. The communication device according to claim 1, wherein the mobile application is a sensing application continuously operating in background of the mobile device.

7. The communication device according to claim 1, wherein the emulator manager divides the sensor usage trace into a plurality of sensor trace segments and assigns the sensor trace segments to the emulator instances.

8. The communication device according to claim 7, wherein the emulator manager aggregates hardware usage statistics segments generated in the emulator instances based on the sensor trace segments.

9. The communication device according to claim 7, wherein the emulator manager divides the device usage trace into a plurality of device trace segments and assigns the device trace segments to the emulator instances.

10. The communication device according to claim 1, wherein the sensor emulator performs sampling of sensor data in the sensor usage trace in accordance with a sensing rate demanded by the mobile application.

11. The communication device according to claim 1, wherein an interpolation is performed on adjacent sensor data in the sensor usage trace to provide data demanded by the mobile application.

12. The communication device according to claim 1, the emulator instance further comprises:
a time accelerator, skipping idle time of the sensor usage trace during operation of the sensor emulator, to reduce operation time of the power emulator.

13. The communication device according to claim 12, wherein the time accelerator determines the idle time of the sensor usage trace from a power manager of an operating system, which manages wakelocks.

14. The communication device according to claim 13, wherein the time accelerator determines a start of the idle time when the wakelocks are all released.

15. The communication device according to claim 1, wherein the power impact estimator computes a net power increase of the mobile application, and
wherein the net power increase is obtained by deducting a power consumption estimate value when the mobile application is not running from a power consumption estimate value when the mobile application is running.

16. The communication device according to claim 15, wherein the power consumption estimate value uses a finite state machine model of hardware when the mobile application is running.

17. A communication system, which comprises a mobile device of a user and a server device:
the mobile device of the user, performing a mobile application and comprising
a sensor trace collector, collecting sensor usage trace of the user, and
a device trace collector, collecting device usage trace indicating usage pattern of the mobile device of the user; and
the server device comprising:
a user trace manager, managing the sensor usage trace and the device usage trace;
a power emulator, executing an executable file of the mobile application and generating hardware usage statistics based on the sensor usage trace and the device usage trace prior to installation of the mobile application to reproduce an execution environment associated with power impact of the mobile application; and a power impact estimator, computing an increase in power consumption based on the hardware usage statistics;

wherein the power emulator comprises:

a plurality of emulator instances, executing parallel emulation; and an emulator manager, receiving the sensor usage trace and the device usage trace from the user trace manager and providing the traces to the emulator instances, and receiving hardware usage statistics from the emulator instances, and the emulator instance comprises:

a sensor emulator, responding to a request by the mobile application and mimicking operation of a sensor of the mobile device based on the sensor usage trace; and a device usage replayer, reflecting device-sharing effect of the mobile application and at least one other mobile application based on the device usage trace.

18. The communication system according to claim 17, wherein the wherein the sensor usage trace is collected from a sensor of the mobile device.

19. The communication system according to claim 17, wherein the device usage trace indicates the device-sharing effect of the mobile application and the at least one other mobile application.

20. A method of predicting power consumption of a mobile application, comprising:

a step of collecting a user's sensor usage trace and device usage trace showing the user's usage pattern of the user's mobile device;

a step of executing an executable file of the mobile application and generating hardware usage statistics based on the sensor usage trace and the device usage trace, wherein the step of generating the hardware usage statistics further comprises:

a step of receiving the sensor usage trace and the device usage trace from the mobile device;

a step of initiating a plurality of emulator instances;

a step of installing the mobile application in the plurality of emulator instances; and a step of generating the hardware usage statistic by executing executable files of the mobile application in the emulator instances; and a step of computing an increase in power consumption of the mobile application based on the hardware usage statistics;

wherein the emulator instance comprises:

a sensor emulator, responding to a request by the mobile application and mimicking operation of a sensor of the mobile device based on the sensor usage trace; and a device usage replayer, reflecting device-sharing effect of the mobile application and at least one other mobile application based on the device usage trace.

21. The method of predicting power consumption of a mobile application according to claim 20, wherein the sensor usage trace is collected from a sensor of the mobile device.

22. The method of predicting power consumption of a mobile application according to claim 20, the device usage trace indicates device-sharing effect of the mobile application and at least one other mobile application.

23. The method of predicting power consumption of a mobile application according to claim 20, wherein the step of generating the hardware usage statistics further comprises:

a step of dividing the sensor usage trace into a plurality of sensor trace segments and assigning the trace segments to the emulator instances.

24. The method of predicting power consumption of a mobile application according to claim 23, wherein the step of generating the hardware usage statistics further comprises:

a step of aggregating hardware usage statistics segments generated in the emulator instances based on the divided sensor trace segments.

25. A method of providing estimated power use of a mobile application, comprising:

collecting a user's sensor usage trace and device usage trace reflecting the user's mobile device usage pattern, using a user trace manager;

generating hardware usage statistics based on the sensor usage trace and the device usage trace by executing an executable file of a mobile application, using a power emulator;

computing an increase in power use of the mobile application based on the hardware usage statistics;

determining a decrease in operation time of the mobile device based on the increase in power use, when the mobile application is executed; and displaying the decrease in operation time in a display unit of the mobile device;

wherein the power emulator comprises:

a plurality of emulator instances, executing parallel emulation; and an emulator manager, receiving the sensor usage trace and the device usage trace from the user trace manager and providing the traces to the emulator instances; and receiving hardware usage statistics from the emulator instances;

wherein the emulator instance comprises:

a sensor emulator, responding to a request by the mobile application and mimicking operation of an actual sensor of the mobile device based on the sensor usage trace;

a device usage replayer, reproducing the user's mobile device usage to reflect in the emulation, device-sharing effect of the mobile application and at least one other mobile application based on the device usage trace; and a hardware usage monitor, collecting the hardware usage statistics.

26. The method of providing estimated power use of a mobile application according to claim 25, wherein the increase in power use of the mobile application comprises an increase in power use during weekdays and an increase in power use during a weekend, and wherein the decrease in operation time comprises a decrease in operation time during the weekdays and a decrease in operation time during the weekend.

* * * * *